United States Patent
Raring et al.

(10) Patent No.: US 8,422,525 B1
(45) Date of Patent: Apr. 16, 2013

(54) OPTICAL DEVICE STRUCTURE USING MISCUT GAN SUBSTRATES FOR LASER APPLICATIONS

(75) Inventors: James W. Raring, Goleta, CA (US); Daniel F. Feezell, Goleta, CA (US); Nicholas J. Pfister, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 12/749,466

(22) Filed: Mar. 29, 2010

Related U.S. Application Data

(60) Provisional application No. 61/164,409, filed on Mar. 28, 2009.

(51) Int. Cl.
*H01S 5/00* (2006.01)

(52) U.S. Cl.
USPC .................. 372/44.011; 372/43.01; 372/50.1; 257/26; 257/39; 257/47; 257/94; 257/99

(58) Field of Classification Search ............. 372/44.011; 257/26, 39, 47, 13, 94, 99
See application file for complete search history.

(56) References Cited

U.S. PATENT DOCUMENTS

| | | | |
|---|---|---|---|
| 5,331,654 A | 7/1994 | Jewell et al. | |
| 5,527,417 A | 6/1996 | Iida et al. | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,821,555 A | 10/1998 | Saito et al. | |
| 6,069,394 A | 5/2000 | Hashimoto et al. | |
| 6,680,959 B2 | 1/2004 | Tanabe et al. | |
| 6,734,461 B1 | 5/2004 | Shiomi et al. | |
| 6,809,781 B2 | 10/2004 | Setlur et al. | |
| 6,833,564 B2 | 12/2004 | Shen et al. | |
| 7,128,849 B2 | 10/2006 | Setlur et al. | |
| 7,303,630 B2 | 12/2007 | Motoki et al. | |
| 7,358,542 B2 | 4/2008 | Radkov et al. | |
| 7,358,543 B2 | 4/2008 | Chua et al. | |
| 7,390,359 B2 | 6/2008 | Miyanaga et al. | |
| 7,483,466 B2 | 1/2009 | Uchida et al. | |
| 7,489,441 B2 | 2/2009 | Scheible et al. | |

(Continued)

FOREIGN PATENT DOCUMENTS

| | | |
|---|---|---|
| JP | 3-287770 | 12/1991 |
| JP | 2007-068398 | 4/2008 |
| WO | WO2008-041521 | 4/2008 |

OTHER PUBLICATIONS

Okamoto et. al "Continuous-Wave Operation of m-Plane InGaN Multiple Quantum Well Laser Diodes" The Japan Society of Applied Physics JJAP Express LEtter, vol. 46, No. 9, 2007 pp. L187-L189.*

(Continued)

*Primary Examiner* — Jessica Stultz
*Assistant Examiner* — Delma R Forde
(74) *Attorney, Agent, or Firm* — Kilpatrick Townsend & Stockton LLP

(57) ABSTRACT

An optical device capable of emitting light having a wavelength ranging from about 490 to about 580 nanometers has a gallium nitride substrate with a semipolar crystalline surface region characterized by an orientation of greater than 3 degrees from (11-22) towards (0001) but less than about 50 degrees. A laser stripe formed on the substrate has a cavity orientation substantially parallel to the m-direction.

18 Claims, 5 Drawing Sheets

U.S. PATENT DOCUMENTS

| | | | |
|---|---|---|---|
| 7,555,025 B2 * | 6/2009 | Yoshida | 372/49.01 |
| 7,733,571 B1 | 6/2010 | Li | |
| 7,858,408 B2 | 12/2010 | Mueller et al. | |
| 7,862,761 B2 | 1/2011 | Okushima et al. | |
| 7,923,741 B1 | 4/2011 | Zhai et al. | |
| 7,939,354 B2 | 5/2011 | Kyono et al. | |
| 7,968,864 B2 * | 6/2011 | Akita et al. | 257/11 |
| 8,044,412 B2 | 10/2011 | Murphy et al. | |
| 8,124,996 B2 | 2/2012 | Raring et al. | |
| 8,126,024 B1 | 2/2012 | Raring | |
| 8,143,148 B1 | 3/2012 | Raring et al. | |
| 8,242,522 B1 | 8/2012 | Raring | |
| 8,247,887 B1 | 8/2012 | Raring et al. | |
| 8,252,662 B1 | 8/2012 | Poblenz et al. | |
| 8,254,425 B1 | 8/2012 | Raring | |
| 8,259,769 B1 | 9/2012 | Raring et al. | |
| 2002/0085603 A1 | 7/2002 | Okumura | |
| 2003/0000453 A1 | 1/2003 | Unno et al. | |
| 2003/0001238 A1 | 1/2003 | Ban | |
| 2003/0012243 A1 | 1/2003 | Okumura | |
| 2003/0020087 A1 | 1/2003 | Goto et al. | |
| 2003/0200931 A1 | 10/2003 | Goodwin | |
| 2003/0216011 A1 | 11/2003 | Nakamura et al. | |
| 2004/0099213 A1 | 5/2004 | Adomaitis et al. | |
| 2004/0151222 A1 | 8/2004 | Sekine | |
| 2005/0040384 A1 | 2/2005 | Tanaka et al. | |
| 2005/0072986 A1 | 4/2005 | Sasaoka | |
| 2006/0060131 A1 | 3/2006 | Atanackovic | |
| 2006/0078022 A1 | 4/2006 | Kozaki et al. | |
| 2006/0079082 A1 | 4/2006 | Bruhns et al. | |
| 2006/0189098 A1 | 8/2006 | Edmond | |
| 2006/0193359 A1 | 8/2006 | Kuramoto | |
| 2006/0216416 A1 | 9/2006 | Sumakeris et al. | |
| 2007/0081857 A1 | 4/2007 | Yoon | |
| 2007/0093073 A1 | 4/2007 | Farrell, Jr. et al. | |
| 2007/0110112 A1 | 5/2007 | Sugiura | |
| 2007/0217462 A1 | 9/2007 | Yamasaki | |
| 2007/0280320 A1 | 12/2007 | Feezell et al. | |
| 2008/0095492 A1 | 4/2008 | Son et al. | |
| 2008/0164578 A1 | 7/2008 | Tanikella et al. | |
| 2008/0191223 A1 * | 8/2008 | Nakamura et al. | 257/95 |
| 2008/0217745 A1 | 9/2008 | Miyanaga et al. | |
| 2008/0232416 A1 * | 9/2008 | Okamoto et al. | 372/45.01 |
| 2008/0251020 A1 | 10/2008 | Franken et al. | |
| 2008/0291961 A1 | 11/2008 | Kamikawa et al. | |
| 2008/0303033 A1 | 12/2008 | Brandes | |
| 2008/0308815 A1 | 12/2008 | Kasai et al. | |
| 2008/0315179 A1 | 12/2008 | Kim et al. | |
| 2009/0058532 A1 | 3/2009 | Kikkawa et al. | |
| 2009/0078944 A1 * | 3/2009 | Kubota et al. | 257/88 |
| 2009/0080857 A1 | 3/2009 | St. John-Larkin | |
| 2009/0141765 A1 | 6/2009 | Kohda et al. | |
| 2009/0267100 A1 * | 10/2009 | Miyake et al. | 257/98 |
| 2009/0273005 A1 | 11/2009 | Lin | |
| 2009/0321778 A1 | 12/2009 | Chen et al. | |
| 2010/0006873 A1 | 1/2010 | Raring et al. | |
| 2010/0096615 A1 * | 4/2010 | Okamoto et al. | 257/13 |
| 2010/0195687 A1 | 8/2010 | Okamoto et al. | |
| 2010/0220262 A1 | 9/2010 | Demille et al. | |
| 2010/0295054 A1 * | 11/2010 | Okamoto et al. | 257/76 |
| 2010/0309943 A1 | 12/2010 | Chakraborty et al. | |
| 2010/0316075 A1 * | 12/2010 | Raring et al. | 372/44.011 |
| 2011/0056429 A1 | 3/2011 | Raring et al. | |
| 2011/0057167 A1 * | 3/2011 | Ueno et al. | 257/13 |
| 2011/0064100 A1 * | 3/2011 | Raring et al. | 372/44.011 |
| 2011/0064101 A1 * | 3/2011 | Raring et al. | 372/44.011 |
| 2011/0064102 A1 * | 3/2011 | Raring et al. | 372/44.011 |
| 2011/0075694 A1 | 3/2011 | Yoshizumi et al. | |
| 2011/0103418 A1 * | 5/2011 | Hardy et al. | 372/44.01 |
| 2011/0164637 A1 | 7/2011 | Yoshizumi et al. | |
| 2011/0180781 A1 | 7/2011 | Raring et al. | |
| 2011/0182056 A1 | 7/2011 | Trottier et al. | |
| 2011/0216795 A1 | 9/2011 | Hsu et al. | |
| 2011/0247556 A1 | 10/2011 | Raring et al. | |
| 2011/0286484 A1 | 11/2011 | Raring et al. | |
| 2012/0104359 A1 | 5/2012 | Felker et al. | |
| 2012/0178198 A1 | 7/2012 | Raring et al. | |
| 2012/0187371 A1 | 7/2012 | Raring et al. | |

OTHER PUBLICATIONS

A. E. Romanov, "Strain-induced polarization in wurtzite III-nitride semipolar layers", Journal of Applied Physics 100, Jul. 25, 2006, pp. 023522-1 through 023522-10.*

M. Asif Khan, "Cleaved cavity optically pumped InGaN-GaN laser grown on spinel substrates", Appl. Phys. Lett. 69 (16), Oct. 14, 1996, pp. 2418-2420.*

A. C. Abare, "Cleaved and Etched Facet Nitride Laser Diodes", IEEE Journal of Selected Topics in Quantum Electronics, vol. 4, No. 3, May/Jun. 1998, pp. 505-509.*

Seoung-Hwan Park, "Crystal orientation effects on electronic properties of wurtzite InGaN/GaN quantum wells", Journal of Applied Physics vol. 91, No. 12 Jun. 15, 2002, pp. 9904-9908.*

Thomas Schoedl, "Facet degradation of GaN heterostructure laser diodes", Journal of Applied Physics 97, 123102 (2005), pp. 123102-1 to 123102-8.*

Sizov et al., "500-nm Optical Gain Anisotropy of Semipolar (1122) InGaN Quantum Wells," 2009, Applied Physics Express, vol. 2, pp. 071001-1-071001-3.

Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.

Office action for U.S. Appl. No. 12/497,289 (Feb. 2, 2012).

Office action for U.S. Appl. No. 13/046,565 (Feb. 2, 2012).

Founta et al., 'Anisotropic Morphology of Nonpolar a-Plane GaN Quantum Dots and Quantum Wells,' Journal of Applied Physics, vol. 102, 2007, pp. 074304-1-074304-6.

Lin et al., 'Influence of Separate Confinement Heterostructure Layer on Carrier Distribution in InGaAsP Laser Diodes With Nonidentical Multiple Quantum Wells,' Japanese Journal of Applied Physics, vol. 43, No. 10, 2004, pp. 7032-7035.

Okamoto et al., 'High-Efficiency Continuous-Wave Operation of Blue-Green Laser Diodes Based on Nonpolar mPlane Gallium Nitride,' The Japan Society of Applied Physics, Applied Physics, Express 1, 2008, pp. 072201-1-072201-3.

Zhong et al., 'Demonstration of High Power Blue-Green Light Emitting Diode on Semipolar (1122) Bulk GaN Substrate,' Electronics Letters, vol. 43, No. 15, 2007, pp. 825-826.

USPTO Office Action for U.S. Appl. No. 12/481,543 dated Jun. 27, 2011.

USPTO Office Action for U.S. Appl. No. 12/482,440 dated Feb. 23, 2011.

USPTO Office Action for U.S. Appl. No. 12/482,440 dated Aug. 12, 2011.

USPTO Office Action for U.S. Appl. No. 12/484,924 dated Apr. 14, 2011.

USPTO Office Action for U.S. Appl. No. 12/491,169 dated Oct. 22, 2010.

USPTO Office Action for U.S. Appl. No. 12/491,169 dated May 11, 2011.

USPTO Notice of Allowance for U.S. Appl. No. 12/497,289 dated May 22, 2012.

USPTO Office Action for U.S. Appl. No. 12/502,058 dated Dec. 8, 2010.

USPTO Office Action for U.S. Appl. No. 12/502,058 dated Aug. 19, 2011.

USPTO Notice of Allowance for U.S. Appl. No. 12/502,058 dated Apr. 16, 2012.

USPTO Office Action for U.S. Appl. No. 12/534,829 dated Apr. 19, 2011.

USPTO Notice of Allowance for U.S. Appl. No. 12/534,829 dated Oct. 28, 2011.

USPTO Notice of Allowance for U.S. Appl. No. 12/534,829 dated Dec. 5, 2011.

USPTO Notice of Allowance for U.S. Appl. No. 12/534,829 dated Dec. 21, 2011.

USPTO Office Action for U.S. Appl. No. 12/573,820 dated Mar. 2, 2011.

USPTO Office Action for U.S. Appl. No. 12/573,820 dated Oct. 11, 2011.

USPTO Office Action for U.S. Appl. No. 12/749,476 dated Apr. 11, 2011.

USPTO Office Action for U.S. Appl. No. 12/749,476 dated Nov. 8, 2011.
USPTO Notice of Allowance for U.S. Appl. No. 12/749,476 dated May 4, 2012.
USPTO Notice of Allowance for U.S. Appl. No. 12/762,269 dated Apr. 23, 2012.
USPTO Office Action for U.S. Appl. No. 12/762,271 dated Jun. 6, 2012.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Office Action for U.S. Appl. No. 12/883,093 dated Mar. 13, 2012.
USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Apr. 13, 2012.
USPTO Notice of Allowance for U.S. Appl. No. 12/502,058 dated Jul. 19, 2012.
USPTO Notice of Allowance for U.S. Appl. No. 12/749,476 dated Jun. 26, 2012.
USPTO Office Action for U.S. Appl. No. 12/759,273 dated Jun. 26, 2012.
USPTO Notice of Allowance for U.S. Appl. No. 12/762,271 dated Aug. 8, 2012.
USPTO Notice of Allowance for U.S. Appl. No. 12/880,803 dated Jul. 18, 2012.
USPTO Office Action for U.S. Appl. No. 12/883,093 dated Aug. 3, 2012.
USPTO Office Action for U.S. Appl. No. 12/884,993 dated Aug. 2, 2012.
USPTO Office Action for U.S. Appl. No. 12/995,946 dated Mar. 28, 2012.
USPTO Office Action for U.S. Appl. No. 13/046,565 dated Jul. 19, 2012.

* cited by examiner m-face cleave

Projection of c-direction m- direction (11-22) Top View

OPTICAL DEVICE STRUCTURE USING MISCUT GAN SUBSTRATES FOR LASER APPLICATIONS

CROSS-REFERENCES TO RELATED APPLICATIONS

This application claims priority to U.S. Provisional Application No. 61/164,409 filed Mar. 28, 2009, commonly assigned, and incorporated by reference in its entirety for all purpose herein.

BACKGROUND OF THE INVENTION

The present invention is directed to optical devices and related methods. More particularly, the present invention provides a method and device for emitting electromagnetic radiation using semipolar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional Edison light bulb:

First, the conventional light bulb dissipates much thermal energy. More than 90% of the energy used for the conventional light bulb dissipates as thermal energy.

Secondly, reliability is an issue since the conventional light bulb routinely fails often due to thermal expansion and contraction of the filament element.

Thirdly, light bulbs emit light over a broad spectrum, much of which does not result in bright illumination or due to the spectral sensitivity of the human eye.

Lastly, light bulbs emit in all directions and are not ideal for applications requiring strong directionality or focus such as projection displays, optical data storage, or specialized directed lighting.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application.

From the above, it is seen that techniques for improving optical devices is highly desired.

BRIEF SUMMARY OF THE INVENTION

According to the present invention, techniques related generally to optical devices are provided. More particularly, the present invention provides a method and device for emitting electromagnetic radiation using semipolar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In a specific embodiment, the present invention provides a cleaved facet laser diode operating at +500 nm fabricated on a semipolar substrate with a surface orientation off of (11-22) towards (0001). The surface orientation is configured as a simple intentional miscut of >3.0 deg from (11-22) towards (0001) or be specified by a different crystal plane such as (11-23), which has an angle of 11.1 degrees off of (11-22) towards (0001). As used herein, the term "miscut" should be interpreted by ordinary meaning, and should not limiting. The term "miscut" can generally mean any off-set cut from one of the common crystal planes according to one or more embodiments. In a specific embodiment, the present device has cleaved facet mirrors for the laser diodes along the m-face of the substrate. In a preferred embodiment, the laser diodes characterized with a wavelength of +500 nm fabricated on such a surface orientation will have the proper polarization for high gain with stripes oriented in the m-direction, which enable m-face cleaves due to the charge neutrality of the m-plane.

In an alternative specific embodiment, the present invention provides an optical device capable of emitting light having a wavelength ranging from about 500 to about 580 nanometers, but can be other wavelengths. The device has a gallium nitride substrate member having a semipolar crystalline surface region characterized by an orientation of greater than 3 degrees from the (11-22) plane towards the (0001) plane but less than about 50 degrees. Preferably, the device also has a laser stripe region formed overlying a portion of the semipolar crystalline orientation surface region. In a preferred embodiment, the laser stripe region, which is epitaxially formed, is configured with the same crystalline orientation as the gallium nitride substrate. In a specific embodiment, the laser stripe region is characterized by a cavity orientation is substantially parallel to the m-direction. The laser strip region has a first end and a second end, which are substantially parallel to each other. In a specific embodiment, the device has a first cleaved m-face facet provided on the first end of the laser stripe region and a second cleaved m-face facet provided on the second end of the laser stripe region.

In an alternative specific embodiment, the present invention provides a method for forming an optical device. The method includes providing a gallium nitride substrate member having a semipolar crystalline surface region characterized by an orientation of greater than 2 degrees from (11-22) towards (0001) but less than about 50 degrees. The method includes forming a laser stripe region overlying a portion of the semipolar crystalline orientation surface region. In a preferred embodiment, the laser stripe region is characterized by a cavity orientation is substantially parallel to the m-direction. In a preferred embodiment, the laser strip region has a first end and a second end. The method forms a pair of facets comprising a first cleaved m-face facet provided on the first end of the laser stripe region and a second cleaved m-face facet provided on the second end of the laser stripe region.

Benefits are achieved over pre-existing techniques using the present invention. In particular, the present invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a semipolar gallium nitride material capable of achieve a green laser device, blue laser device, among others. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

Figure 1:
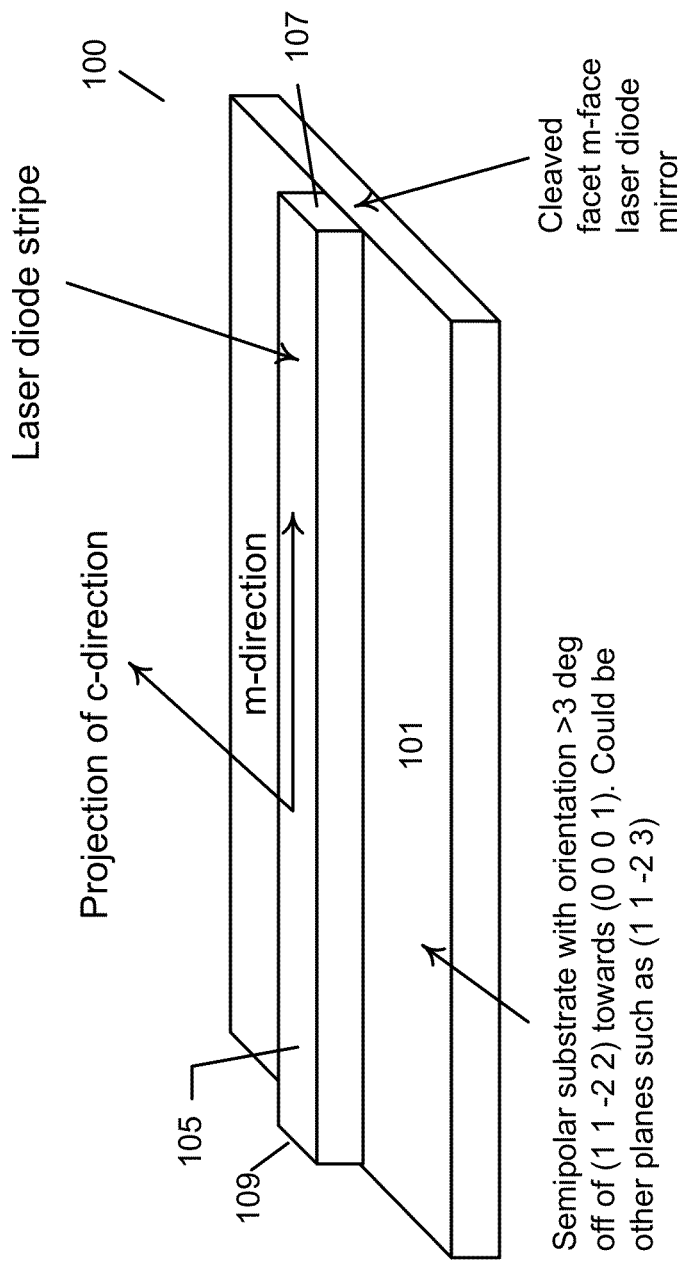
FIG. 1 is a simplified perspective view of a laser device fabricated on a semipolar substrate according to an embodiment of the present invention.

In a specific embodiment, the (11-22) GaN crystallographic plane is desirable in the field of GaN optoelectronic devices due to its high indium uptake in InGaN films that enable efficient light emission into the green wavelength region. Furthermore, it has been discovered that the m-face of the (11-22) substrate can be cleaved to form laser facet quality surfaces, which is believed to be one of the key characteristics for manufacturing low cost laser diodes. In order to use such cleave plane, the laser stripes are preferably oriented in the m-direction on the substrate surface such that the stripe is normal to the mirror. By the rules of electromagnetics, the polarization of the light generated in the semiconductor is generally orthogonal to the propagation direction, which in the case of a laser is in the stripe direction. The polarization of the light is governed by the valence band structure within the semiconductor crystal. It has also discovered that when increasing the indium composition in the InGaN layers to achieve wavelengths beyond ~490 nm there is a switch in the polarization from orthogonal to the projection of the c-direction to parallel to the projection of the c-direction (m-direction). Therefore the polarization switches to the orientation that is favorable for m-direction laser stripes on (11-22), which may enable exploitation of the optimal m-face cleaves for m-oriented laser diodes. Of course, there can be other planes within the (11-22) family. Since the polarization switch occurs at around the 490-500 nm range, a green laser device operating in the +520 nm range would be a great candidate for a (11-22) m-direction oriented laser diode. However, the polarization ratio observed on (11-22) in the 520 nm region, indicated that the light was only slightly oriented in the parallel to the projection of the c-direction. For improved laser performance, a higher polarization ratio is desired.

In a specific embodiment, the present invention provides an optical device characterized by an increase in polarization ratio oriented perpendicular to the m-direction for improved laser performance. A high polarization ratio is often desirable for a laser diode because it implies that electronic carriers are not being wasted by having to fill other nearby valence bands with the opposite polarization, which do not contribute to useful gain in the laser. As used herein, the term "high polarization ratio" often refers to a polarization ratio of greater than +0.2, which is maintained at current densities on the order of typical laser thresholds (0.5-5 kA/cm2), where the ratio contains the emission intensity polarized parallel to the projection of the c direction less the emission intensity polarized perpendicular to the projection of the c direction in the numerator and the emission intensity polarized parallel to the projection of the c direction plus the emission intensity polarized perpendicular to the projection of the c direction in the denominator according to one or more embodiments.

1. InGaN layers grown on m-plane (nonpolar) GaN emitting in the 485 nm range demonstrate strong polarization perpendicular to the c-direction such that lasers should be oriented along the c-direction.

2. It has been reported that a-plane (nonpolar) GaN has a similar valence band structure to m-plane GaN. It is therefore believed that a-plane GaN will have the same polarization properties as m-plane GaN—polarized perpendicular to c-direction.

3. (11-22) GaN, which is oriented ~58 deg away from c-plane (0001) towards a-plane, demonstrates a polarization that switches from being perpendicular to the projection of the c-direction to perpendicular to the m-direction in the +490 nm range.

4. By the above, it is believed that as the inclination angle from c-plane is decreased, the polarization will become more highly polarized perpendicular to m-direction (parallel to projection of c-direction). Accordingly, off-cuts of (11-22) towards (0001) or alternative growth planes such as the (11-23) or (11-24) increases the polarization ratio perpendicular to the m-direction.

5. Since rotation from (11-22) towards or away from (0001) will still yield an m-face orthogonal to the surface plane, perpendicular m-faces will still exist for cleaving laser facets.

6. By using such semipolar orientations along with achieving good crystal growth on these orientations, a semipolar laser diode operating in the 520 nm regime with cleaved facets are likely achieved.

FIG. 1 is a simplified perspective view of a laser device 100 fabricated on a semipolar substrate according to an embodiment of the present invention. As shown, the optical device includes a gallium nitride substrate member 101 having a semipolar crystalline surface region characterized by an orientation of greater than 3 degrees from (11-22) towards (0001) but less than about 50 degrees. In a specific embodiment, the gallium nitride substrate member is a bulk GaN substrate characterized by having a semipolar crystalline surface region, but can be others. In a specific embodiment, the bulk nitride GaN substrate comprises nitrogen and has a surface dislocation density below 105 cm−2. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about 105 cm−2 and about 108 cm−2, in a direction that is substantially orthogonal or oblique with respect to the surface. As a consequence of the orthogonal or oblique orientation of the dislocations, the surface dislocation density is below about 105 cm−2.

In a specific embodiment, the device has a laser stripe region 105 formed overlying a portion of the semipolar crystalline orientation surface region. In a specific embodiment, the laser stripe region is characterized by a cavity orientation is substantially parallel to the in-direction. In a specific embodiment, the laser strip region has a first end 107 and a second end 109.

In a preferred embodiment, the device has a first cleaved m-face facet provided on the first end of the laser stripe region and a second cleaved m-face facet provided on the second end of the laser stripe region. In one or more embodiments, the first cleaved m-facet is substantially parallel with the second cleaved m-facet. Mirror surfaces are formed on each of the cleaved surfaces. The first cleaved m-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titaniatantalum pentoxidezirconia, including combinations, and the like. Depending upon the embodiment, the first mirror surface can also comprise an anti-reflective coating.

Also in a preferred embodiment, the second cleaved m-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, and titaniatantalum pentoxidezirconia, combinations, and the like. In a specific embodiment, the second mirror surface comprises an anti-reflective coating.

In a specific embodiment, the laser stripe has a length and width. The length ranges from about 50 microns to about 3000 microns. The strip also has a width ranging from about 0.5 microns to about 50 microns, but can be other dimensions. In a specific embodiment, the width is substantially constant in dimension, although there may be slight variations. The width and length are often formed using a masking and etching process, which are commonly used in the art.

In a specific embodiment, the device is also characterized by a spontaneously emitted light is polarized in substantially parallel to the projection of the c-direction. That is, the device performs as a laser or the like. In a preferred embodiment, the spontaneously emitted light is characterized by a polarization ratio of greater than about 0.2 and less than about 1 parallel to the projection of the c-direction. In a preferred embodiment, the spontaneously emitted light characterized by a wavelength ranging from about 500 nanometers to about 580 nanometers to yield a green laser and others. In a preferred embodiment, the spontaneously emitted light is highly polarized and is characterized by a polarization-ratio of greater than 0.4. Of course, there can be other variations, modifications, and alternatives.

Figure 2:
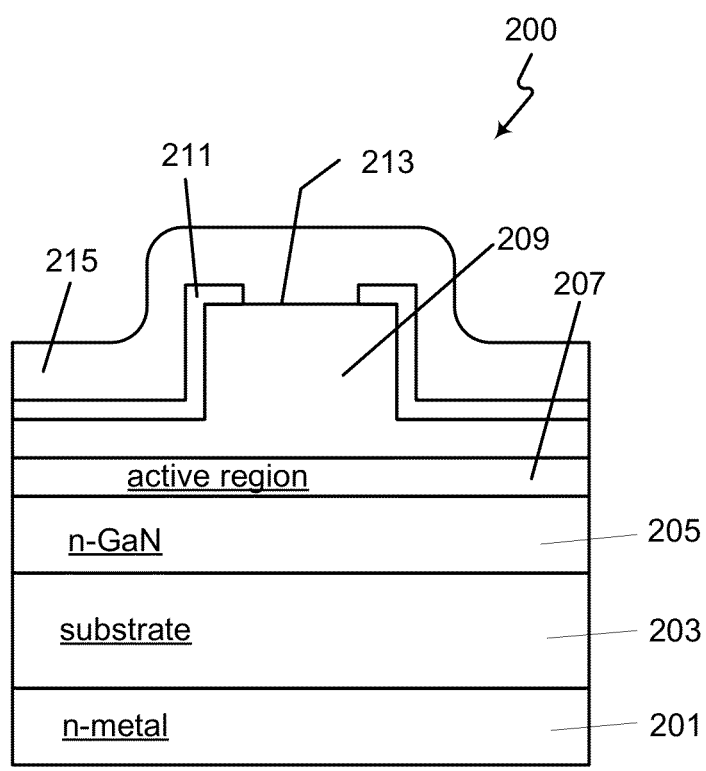
FIG. 2 is a detailed cross-sectional view of a laser device fabricated on a semipolar substrate according to an embodiment of the present invention.

FIG. 2 is a detailed cross-sectional view of a laser device 200 fabricated on a semipolar substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In a specific embodiment, the metal back contact region is made of a suitable material such as those noted below and others.

In a specific embodiment, the device also has an overlying n-type gallium nitride layer 205, an active region 207, and an overlying p-type gallium nitride layer structured as a laser stripe region 209. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type Al$_u$In$_v$Ga$_{1-u-v}$N layer, where $0 \leq u$, $v$, $u+v \leq 1$, is deposited on the substrate. In a specific embodiment, the carrier concentration may lie in the range between about 1016 cm–3 and 1020 cm–3. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 209. In a specific embodiment, the laser stripe is provided by an etching process selected from dry etching or wet etching. In a preferred embodiment, the etching process is an inductively coupled process using chlorine bearing species or a reactive ion etching process using similar chemistries. Again as an example, the chlorine bearing species are commonly derived from chlorine gas or the like. The device also has an overlying dielectric region 211, which exposes 213 contact region. In a specific embodiment, the dielectric region 211 is an oxide such as silicon dioxide or silicon nitride, but can be others. The contact region is coupled to an overlying metal layer 215. The overlying metal layer is a multilayered structure containing gold and platinum (Pt/Au), but can be others.

In a specific embodiment, the laser device has an active region 207. The active region can include one to twenty quantum well regions according to one or more embodiments. As an example following deposition of the n-type Al$_u$In$_v$Ga$_{1-u-v}$N layer for a predetermined period of time, so as to achieve a predetermined thickness, an active layer is deposited. The active layer may comprise a single quantum well or a multiple quantum well, with 1-20 quantum wells. The quantum wells may comprise InGaN wells and GaN barrier layers each having a thickness ranging from about 10 Angstroms to about 50 Angstroms depending on the embodiment. In other embodiments, the well layers and barrier layers comprise Al$_w$In$_x$Ga$_{1-w-x}$N and Al$_y$In$_z$Ga$_{1-y-z}$N, respectively, where $0 \leq w$, $x$, $y$, $z$, $w+x$, $y+z \leq 1$, where w<u, y and/or x>v, z so that the bandgap of the well layer(s) is less than that of the barrier layer(s) and the n-type layer. The well layers and barrier layers may each have a thickness between about 1 nm and about 40 nm. In another embodiment, the active layer comprises a double heterostructure, with an InGaN or Al$_w$In$_x$Ga$_{1-w-x}$N layer about 10 nm to 100 nm thick surrounded by GaN or Al$_y$In$_z$Ga$_{1-y-z}$N layers, where w<u, y and/or x>v, z. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise Al$_s$In$_t$Ga$_{1-s-t}$N, where $0 \leq s$, $t$, $s+t \leq 1$, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm.

As noted, the p-type gallium nitride structure, which can be a p-type doped Al$_q$In$_r$Ga$_{1-q-r}$N, where $0 \leq q$, $r$, $q+r \leq 1$, layer is deposited above the active layer. The p-type layer may be doped with Mg, to a level between about 1016 cm–3 and 1022 cm–3, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region. In a specific embodiment, the dielectric region is an oxide such as silicon dioxide, but can be others.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. Of course, there can be other variations, modifications, and alternatives.

Figure 3:
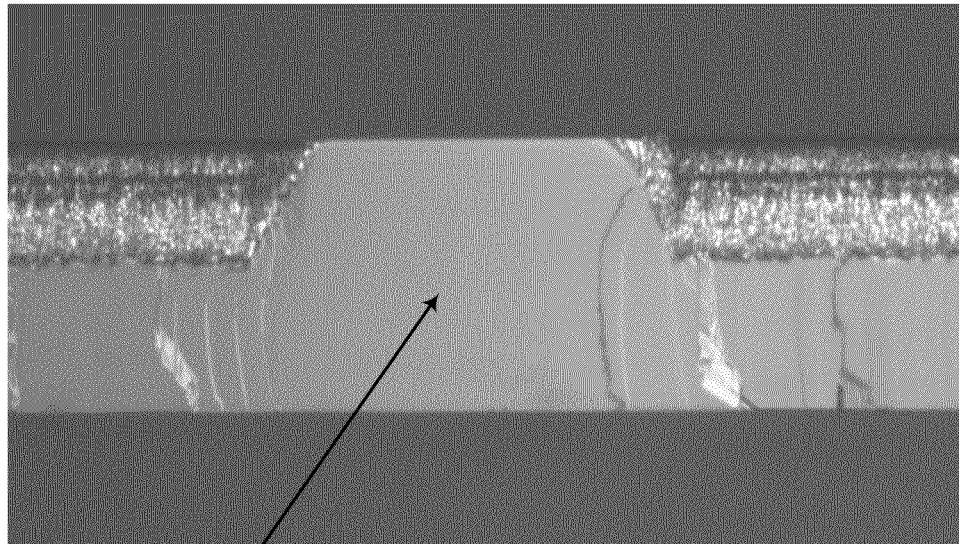
FIG. 3 is a cross-sectional view photograph of an m-direction cleaved facet for a laser device according to an embodiment of the present invention.

FIG. 3 is a cross-sectional view photograph of an m-direction cleaved facet for a laser device according to an embodiment of the present invention. As shown, the m-direction cleaved facet is smooth and provides a suitable mirror surface. In a specific embodiment, the m-direction cleave facets is vertical. In a specific embodiment, one mirror surface has a reflectivity of about 99% and greater and the other mirror surface has a reflectivity of 65% and greater, but could be others. Details of the top-view of the laser device are provided below.

Figure 4:
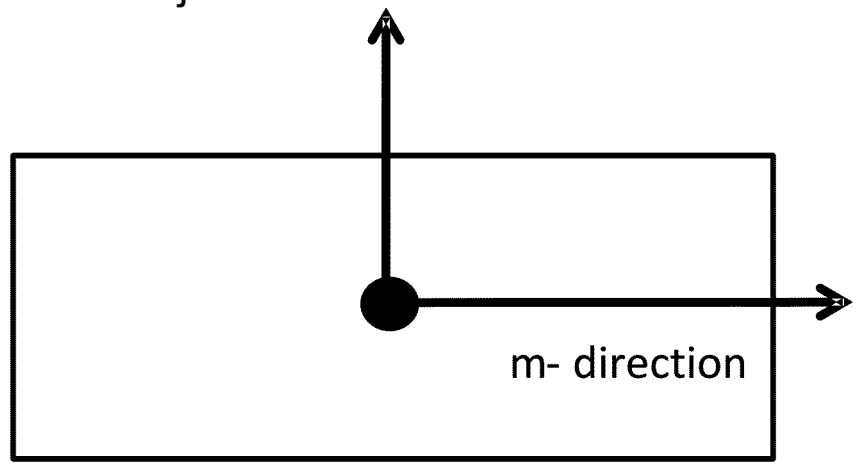
FIG. 4 is a top-view diagram of a laser device according to an embodiment of the present invention.
Figures 5, 6:
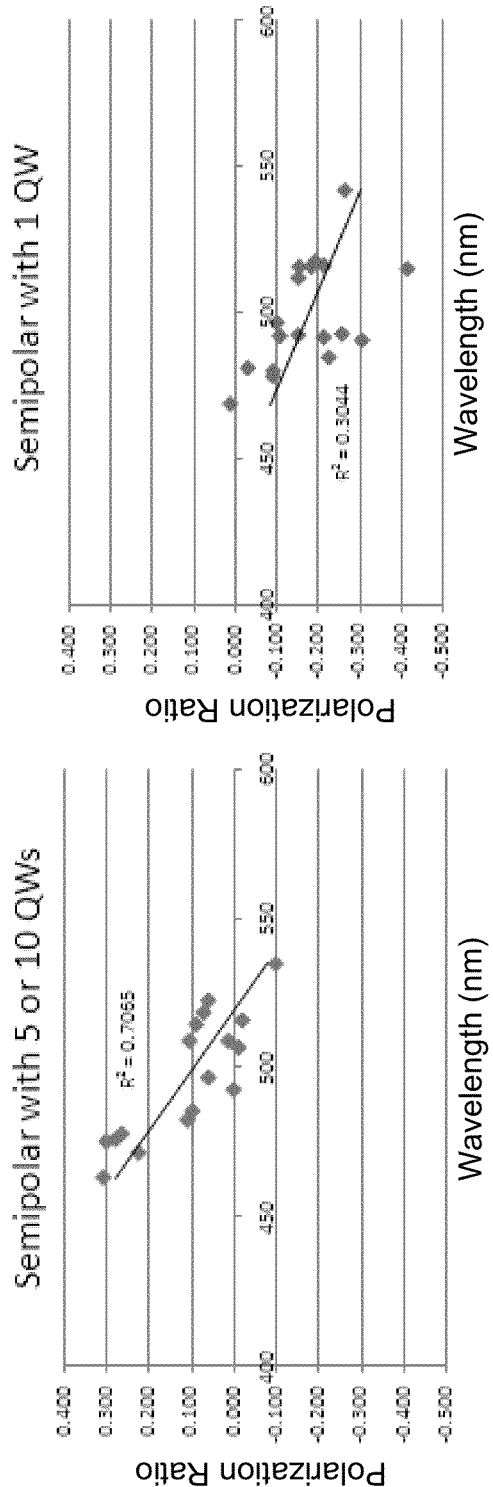
FIGS. 5 and 6 are plots of semipolar (11-22) polarization ratio measurements for optical devices according to embodiments of the present invention.

FIG. 4 is a top-view diagram of a laser device according to an embodiment of the present invention. As shown, the laser stripe is configured in the m-direction, which has a projection in the c-direction. As shown, the top-view of the gallium nitride substrate is of a slight mis-cut of the (11-22) surface region orientation according to a specific embodiment. As shown in FIGS. 5 and 6, polarization becomes slightly favorable for m-strips at wavelengths between 500 nm to 520 nm. As detailed in FIGS. 5 and 6, off-axis orientations increase polarization/gain.

FIGS. 5 and 6 are plots of semipolar (11-22) polarization ratio measurements for optical devices according to embodiments of the present invention. These polarization data are taken at 1 kA/cm2. As illustrated, negative polarization ratio is ideal for m-direction laser, and semipolar polarization ratio decreases with wavelength (In content) and crosses zero somewhere in the 480-510 nm range.

Figure 7:
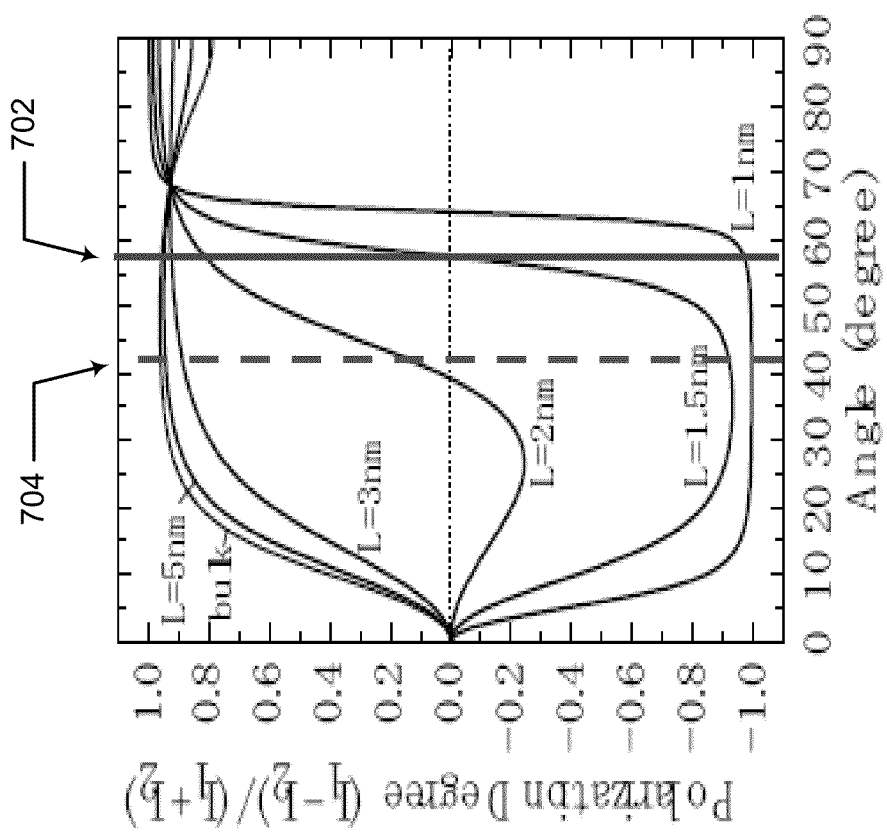
FIG. 7 is a plot of polarization degree against angle for an optical device according to an embodiment of the present invention.

FIG. 7 is a plot of polarization degree against angle for an optical device according to an embodiment of the present invention. This diagram is merely an example, which should not unduly limit the scope of the claims herein. One of ordinary skill in the art would recognize other variations, modifications, and alternatives. As shown, substrate orientation dependencies of the in-plane polarization degree for coherently grown $In_{0.3}Ga_{0.7}N$ on GaN substrates is provided. This figure is taken from: A. Atsushi Yamaguchi, *phys. stat. sol.* (*c*), 1-4 (2008)/DOI 10.1002/pssc. 200778420. Line 702 on the plot indicates (11-22) at 58.4 degrees from c-plane. Other planes with lower angle from c-plane could be more favorable for negative polarization degree. For example, line 704 on the plot indicates (11-23) having an angle of 47.3 degrees from c-plane, but can be others.

While the above is a full description of the specific embodiments, various modifications, alternative constructions and equivalents may be used. Although the above has been configured in a certain plane, others can be used. Therefore, the above description and illustrations should not be taken as limiting the scope of the present invention which is defined by the appended claims.

What is claimed is:

1. A semiconductor laser comprising:
   a gallium nitride substrate having a semipolar crystalline surface region characterized by and an orientation of greater than about 2 degrees from an (11-22) plane toward a (0001) plane, but less than about 50 degrees, and having an m-direction, and a c-projection direction perpendicular to the m-direction;
   a laser region formed over the semipolar crystalline surface region, the laser region having a cavity orientation substantially parallel to the m-direction and extending from a first end to a second end, and having an indium concentration sufficient to cause emission of polarized light of about at least 490 nm wavelength;
   a first cleaved m-face facet on the first end; and
   a second cleaved m-face facet on the second end;
   wherein the laser region emits light polarized substantially parallel to the c-projection direction.

2. The semiconductor laser of claim 1 wherein the first cleaved m-face facet is substantially parallel to the second cleaved m-face facet.

3. The semiconductor laser of claim 2 further comprising a reflective coating over each of the first cleaved m-face facet and the second cleaved m-face facet.

4. The semiconductor laser of claim 3 wherein the reflective coating is selected from silicon dioxide, hafnia, titania, tantalum pentoxide, zirconia, and a combination of any of the foregoing.

5. The semiconductor laser of claim 1 wherein the laser region has a length between about 50 microns and about 3000 microns.

6. The semiconductor laser of claim 1 wherein the laser region has a width between about 0.5 microns and about 50 microns.

7. The semiconductor laser of claim 1 wherein the light polarized substantially parallel to the c-projection direction has a polarization ratio greater than about 0.2 and less than about 1 in the c-projection direction.

8. The semiconductor laser of claim 1 wherein the light polarized substantially parallel to the c-projection direction has a wavelength between about 490 nanometers and about 580 nanometers.

9. The semiconductor laser of claim 1 further comprising an n-type metal contact to a back of the gallium nitride substrate and a p-type metal contact to an upper portion of the laser region.

10. The semiconductor laser of claim 9 wherein the laser region further comprises a dielectric layer over the laser region with an opening for the p-type metal contact to the upper portion of the laser region.

11. The semiconductor laser of claim 1 wherein the laser region comprises
    an n-type gallium nitride region on the semipolar crystalline surface region;
    an active region over the n-type gallium nitride region; and
    a laser stripe region over the active region.

12. The semiconductor laser of claim 11 wherein the active region includes between one and twenty quantum well regions.

13. The semiconductor laser of claim 12 wherein the active region includes an electron blocking region.

14. The semiconductor laser of claim 13 wherein the active region comprises a separate confinement heterostructure.

15. The semiconductor laser of claim 1 wherein the orientation of the semipolar crystalline surface region is approximately (11-23).

16. The semiconductor laser of claim 1 wherein the orientation of the semipolar crystalline surface region is approximately (11-24).

17. The semiconductor laser of claim 1, wherein the semipolar crystalline surface region comprises a surface dislocation density below about $10^5$ $cm^{-2}$.

18. A semiconductor laser comprising:
    a gallium nitride substrate having a semipolar crystalline surface region characterized by an orientation of approximately (11-23) and having an m-direction, and a c-projection direction perpendicular to the m-direction;
    a laser region formed over the semipolar crystalline surface region, the laser region having a cavity orientation substantially parallel to the m-direction and extending from a first end to a second end, and having an indium concentration sufficient to cause emission of polarized light of about at least 490 nm wavelength;
    a first cleaved m-face facet on the first end; and
    a second cleaved m-face facet on the second end;
    wherein the laser region emits light polarized substantially parallel to the c-projection direction.

* * * * *